(12) United States Patent
Chang et al.

(10) Patent No.: US 8,973,646 B2
(45) Date of Patent: Mar. 10, 2015

(54) SLIM TYPE PRESSURE-GRADIENT-DRIVEN LOW-PRESSURE THERMOSIPHON PLATE

(75) Inventors: Shyy-Woei Chang, Sinjhuang (TW); Kuei-Feng Chiang, Sinjhuang (TW); Yun-Jun Gu, Sinjhuang (TW)

(73) Assignee: Asisa Vital Components Co., Ltd., Sinjhuang (TW)

( * ) Notice: Subject to any disclaimer, the term of this patent is extended or adjusted under 35 U.S.C. 154(b) by 643 days.

(21) Appl. No.: 12/870,856

(22) Filed: Aug. 30, 2010

(65) Prior Publication Data

US 2012/0018128 A1 Jan. 26, 2012

(51) Int. Cl.
*F28D 15/00* (2006.01)
*F28F 3/04* (2006.01)
*F28D 15/02* (2006.01)
*H01L 23/473* (2006.01)

(52) U.S. Cl.
CPC ............ *F28F 3/048* (2013.01); *F28D 15/0233* (2013.01); *H01L 23/473* (2013.01)
USPC ............ 165/104.22; 165/104.33; 165/104.26; 165/104.21

(58) Field of Classification Search
USPC ........................................ 165/104.21, 104.26
See application file for complete search history.

(56) References Cited

U.S. PATENT DOCUMENTS

| | | | | |
|---|---|---|---|---|
| 5,769,154 A | * | 6/1998 | Adkins et al. | 165/104.26 |
| 6,698,503 B2 | * | 3/2004 | Son et al. | 165/104.26 |
| 6,889,756 B1 | * | 5/2005 | Hou | 165/104.33 |
| 7,184,265 B2 | * | 2/2007 | Kim et al. | 361/679.47 |
| 7,249,627 B2 | * | 7/2007 | Choi et al. | 165/121 |
| 8,267,166 B2 | * | 9/2012 | Damsleth et al. | 166/57 |
| 2001/0006105 A1 | * | 7/2001 | Watanabe et al. | 165/177 |
| 2003/0150599 A1 | * | 8/2003 | Suzuki | 165/104.21 |
| 2004/0040696 A1 | * | 3/2004 | Cho et al. | 165/104.26 |
| 2006/0157227 A1 | * | 7/2006 | Choi et al. | 165/104.21 |

* cited by examiner

*Primary Examiner* — Allen Flanigan
*Assistant Examiner* — Jason Thompson
(74) *Attorney, Agent, or Firm* — C. G. Mersereau; Nikolai & Mersereau, P.A.

(57) ABSTRACT

A slim type pressure-gradient-driven low-pressure thermosiphon plate includes a main body closed by a cover. The main body includes a central heat receiving zone, a pressure accumulating zone and a first flow passage unit separately located at two opposite sides of the heat receiving zone, a free zone communicating with the pressure accumulating zone, a first and a second condensing zone communicating with the free zone, a third and a fourth condensing zone communicating with the first flow passage unit, a second flow passage unit located between and communicating with the first and the third condensing zone, and a third flow passage unit located between and communicating with the second and the fourth condensing zone. In the thermosiphon plate, a low-pressure end is created through proper pressure-reduction design to form a pressure gradient for driving steam-water circulation, and the working fluid can transfer heat without any wick structure.

7 Claims, 7 Drawing Sheets

SLIM TYPE PRESSURE-GRADIENT-DRIVEN LOW-PRESSURE THERMOSIPHON PLATE

This application claims the priority benefit of Taiwan patent application number 099123952 filed on Jul. 21, 2010.

FIELD OF THE INVENTION

The present invention relates to a slim type pressure-gradient-driven low-pressure thermosiphon plate, and more particularly to a slim type pressure-gradient-driven low-pressure thermosiphon plate that is able to transfer heat without the need of using any wick structure and provides enhanced heat transfer efficiency.

BACKGROUND OF THE INVENTION

With the prosperous development in the electronic semiconductor industry, the progress in the process technique and the trends in the market demands, all kinds of electronic devices have been designed to be compact, low-profile and light in weight. However, while the electronic devices have gradually reduced dimensions, they have increasing functions and computing ability. For example, the notebook computer and the desktop computer, which account for the largest part of products in the information industry, include many electronic elements that would produce heat during the operation thereof. Among others, the central processing unit (CPU) produces the largest part of heat in the computer. Under this circumstance, a heat sink formed from radiating fins and cooling fans for dissipating heat plays an important role in protecting the CPU against overheating, so that the CPU can be maintained at a normal working temperature to fully extend its intended functions. Therefore, the CPU heat sink is a very important component in nowadays information industry.

In recent years, water cooling technique has been widely applied in the personal computer. In the water cooling technique, the large-volume radiating fins are omitted, and heat from the heat sources in the computer system is collected and transferred to the working fluid. Then, the heat-absorbed working fluid exchanges heat with air via a heat exchanger. Since the length of the pipeline for water cooling can be changed according to actual need, the heat exchanger (i.e. the radiating fins) can be flexibly disposed at different positions and can be advantageously designed without spatial restriction. However, a water cooling system requires a pump to drive the working fluid to flow in the pipeline, and a water tank to store sufficient water as the working fluid. That is, the water cooling system is subject to the reliability of the pump, possible leakage in the pipeline, and the like. However, due to the increasing heat produced by the heat-producing element in the personal computer, the water-cooling heat dissipating technique, though not so perfect for use, is still the best choice in the current market for heat management and control. While the water cooling technique can be well applied to the personal computer that has a relatively large volume and is not subject to any spatial restriction, the water cooling technique for heat dissipation seems useless at all in terms of the notebook computer that is compact, low-profile and small volume in design. Therefore, for the present, heat pipes are still used in the notebook computer for heat transfer, and radiating fins are further used to exchange heat with ambient air. Besides the heat pipes and the radiating fins, what the notebook computer can do to protect the CPU is to lower the power consumption of the CPU as much as possible. In view of these problems, the information industry and other related electronic industries all have positively tried to find other heat dissipation techniques capable of providing higher heat flux, so as to meet the growing demands for heat dissipation.

In the conventional heat dissipation techniques, heat pipe and uniform temperature plate are also used as heat transfer elements. In manufacturing the heat pipe and the uniform temperature plate, a sintered layer is formed on the inner wall surface thereof to serve as a wick structure. To form the sintered layer, first fill a type of metal (copper) particles or powder in the inner wall of the heat pipe and the uniform temperature plate, and then tightly press the copper particles or powder before sintering the metal particles or powder in a sinter furnace to form a porous wick structure. While the sintered layer provides a capillary force, it also increases an overall thickness of the heat pipe and the uniform temperature plate, preventing the latter from being effectively slimmed. As to the currently known vapor chamber (VC), it uses a sintered core, grids, or grooves to produce the capillary force for driving steam-water circulation in the heat pipe or the vapor chamber. However, the above structure is not ideal for use because it involves in a very complicated manufacturing process and accordingly, increased manufacturing cost.

Moreover, the selection of a vapor core is not easy. It is very important to select a proper vapor core, which must be able to keep the condensate at a desired flowing speed and must be able to maintain sufficient capillary pressure to overcome any undesired influence from the force of gravity on the vapor and the condensate.

In brief, the prior art heat pipe or vapor chamber has the following disadvantages: (1) uneasy to fabricate; (2) unable to be slimmed; (3) high manufacturing cost; and (4) consuming time and labor to manufacture.

SUMMARY OF THE INVENTION

A primary object of the present invention is to provide a slim type pressure-gradient-driven low-pressure thermosiphon plate, with which no internal wick structure is needed to drive the working fluid in the thermosiphon plate to transfer heat, and the cost of manufacturing the thermosiphon plate can be largely reduced.

Another object of the present invention is to provide a slim type pressure-gradient-driven low-pressure thermosiphon plate with high heat transfer efficiency.

To achieve the above and other objects, the slim type pressure-gradient-driven low-pressure thermosiphon plate according to the present invention includes a main body and a cover correspondingly closed onto the main body. The main body includes a central heat receiving zone, a pressure accumulating zone and a first flow passage unit separately located at two opposite sides of the heat receiving zone, a free zone communicating with the pressure accumulating zone, a first and a second condensing zone communicating with the free zone, a third and a fourth condensing zone communicating with the first flow passage unit, a second flow passage unit located between and communicating with the first and the third condensing zone, and a third flow passage unit located between and communicating with the second and the fourth condensing zone. In the thermosiphon plate, a low-pressure end is created through proper pressure-reduction design to form a pressure gradient for driving steam-water circulation. With the above arrangements, the working fluid in the thermosiphon plate of the present invention can transfer heat without the need of using any wick structure; and the cost of manufacturing the thermosiphon plate can be largely reduced.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
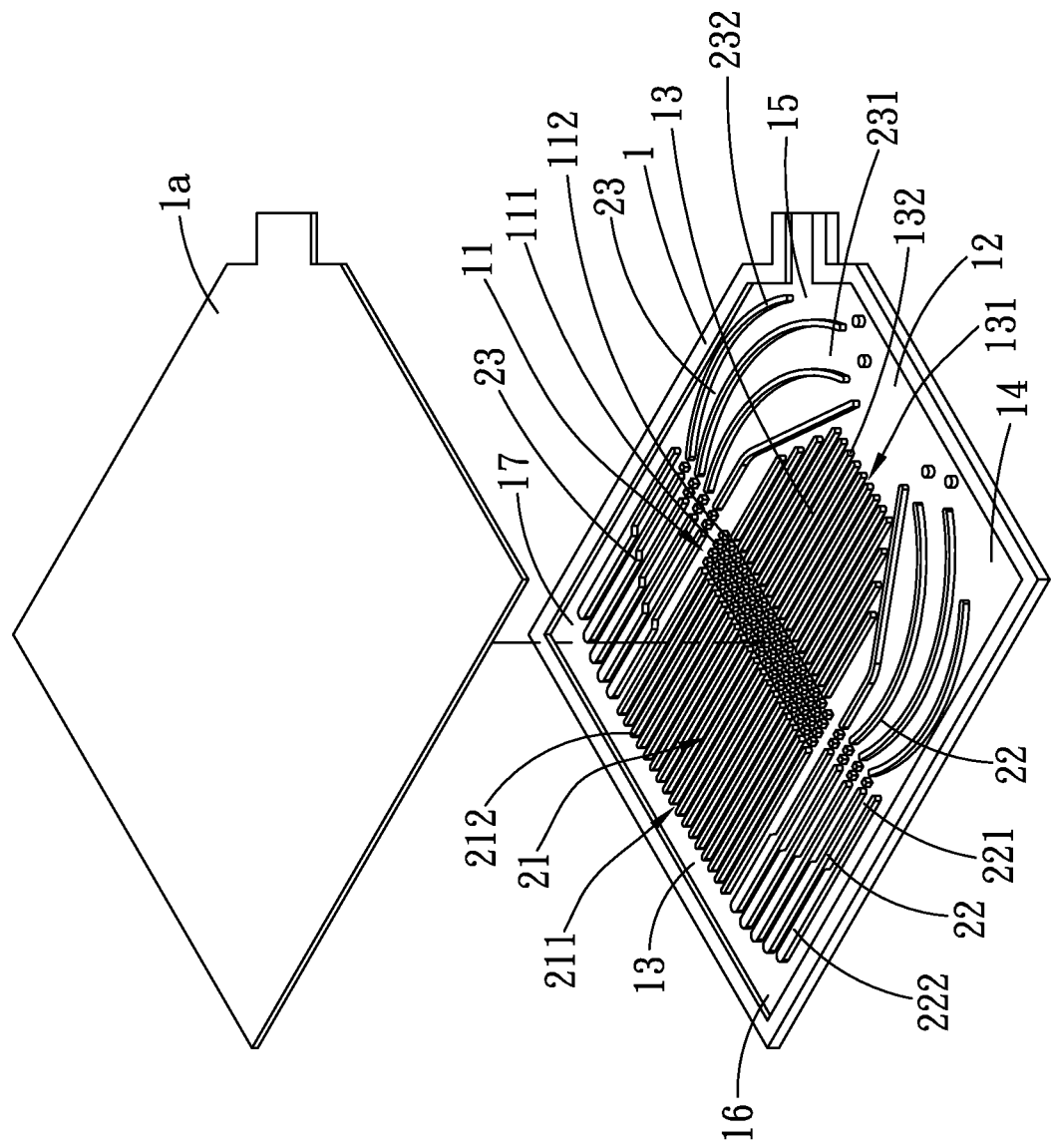
FIG. 1 is an exploded perspective of a slim-type pressure-gradient-driven low-pressure thermosiphon plate according to a first and preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Figure 2:
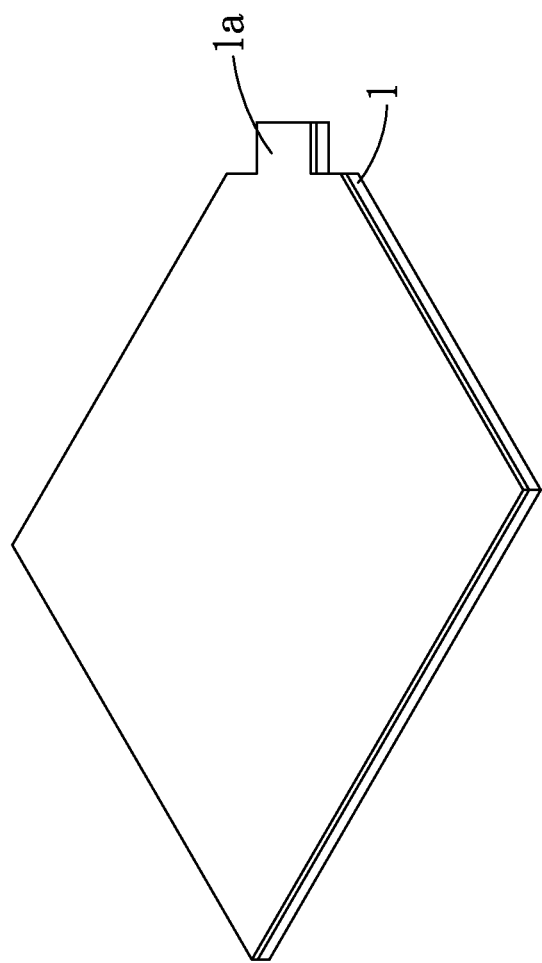
FIG. 2 is an assembled perspective view of FIG. 1.
Figure 3:
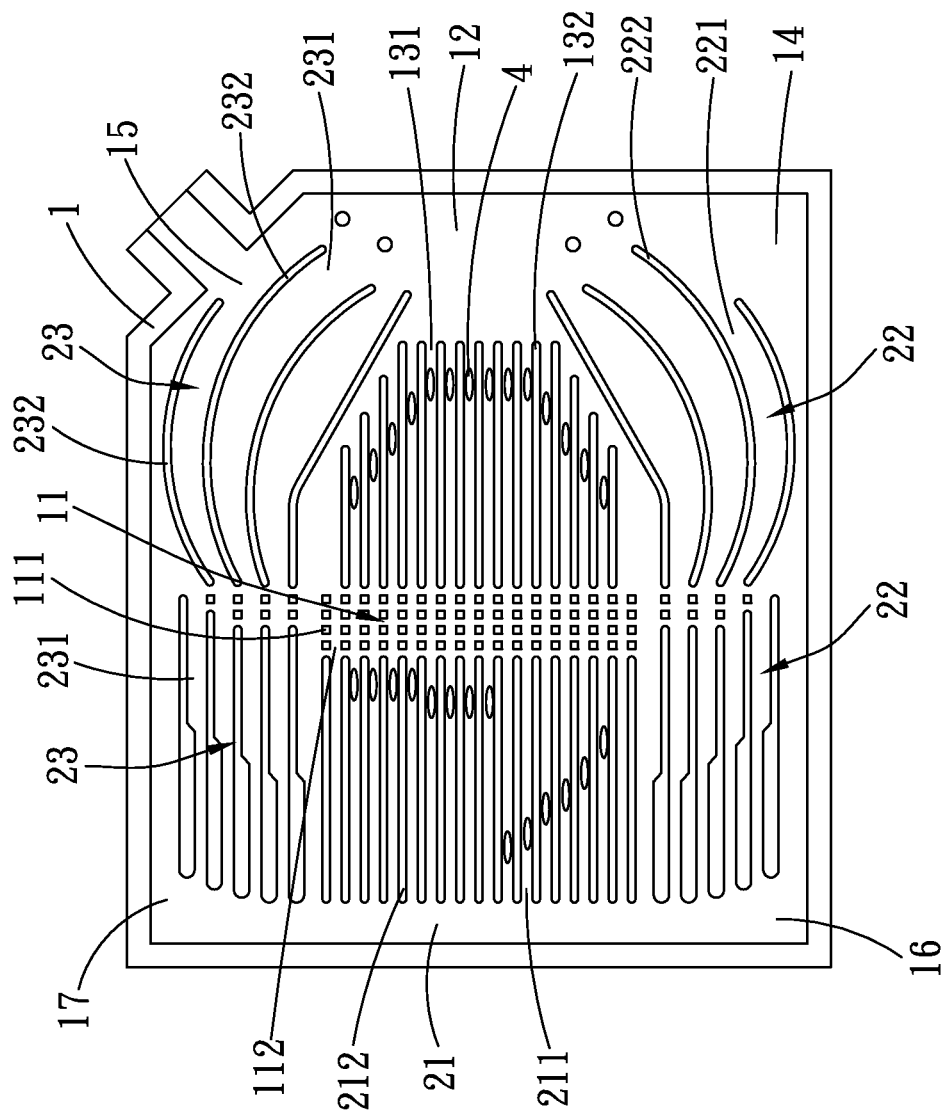
FIG. 3 is a top view of the slim-type pressure-gradient-driven low-pressure thermosiphon plate according to the first and preferred embodiment of the present invention.

Please refer to FIGS. 1, 2 and 3 in which a slim-type pressure-gradient-driven low-pressure thermosiphon plate according to a first and preferred embodiment of the present invention is shown. The slim-type pressure-gradient-driven low-pressure thermosiphon plate includes a main body 1 and a cover 1a.

The cover 1a is correspondingly closed onto the main body 1.

The main body 1 internally includes a heat receiving zone 11, a first flow passage unit 21, a second flow passage unit 22, a third flow passage unit 23, a free zone 12, a pressure accumulating zone 13, a first condensing zone 14, a second condensing zone 15, a third condensing zone 16, and a fourth condensing zone 17.

The heat receiving zone 11 is arranged on the main body 1 near a central area thereof. The first flow passage unit 21 and the pressure accumulating zone 13 are separately located at two opposite sides of the heat receiving zone 11. The pressure accumulating zone 13 includes a plurality of pressure-accumulating flow passages 131 and a plurality of pressure-accumulating flow-guiding members 132. The pressure-accumulating flow passages 131 are respectively formed between two adjacent pressure-accumulating flow-guiding members 132, and communicate with the free zone 12.

The heat receiving zone 11 includes a plurality of raised posts 111 being arrayed to space from one another by a first spacing 112.

The free zone 12 communicates with the first and the second condensing zone 14, 15; and the first flow passage unit 21 communicates with the third and the fourth condensing zone 16, 17.

The second flow passage unit 22 is located between the first and the third condensing zone 14, 16 to communicate the two condensing zones 14, 16 with each other.

The third flow passage unit 23 is located between the second and the fourth condensing zone 15, 17 to communicate the two condensing zones 15, 17 with each other.

The first flow passage unit 21 includes a plurality of first flow passages 211 and a plurality of first flow-guiding members 212. The first flow passages 211 are respectively formed between two adjacent first flow-guiding members 212. The second flow passage unit 22 includes a plurality of second flow passages 221 and a plurality of second flow-guiding members 222. The second flow passages 221 are respectively formed between two adjacent second flow-guiding members 222.

The third flow passage unit 23 includes a plurality of third flow passages 231 and a plurality of third flow-guiding members 232. The third flow passages 231 are respectively formed between two adjacent third flow-guiding members 232.

In the illustrated first and preferred embodiment, the first, second and third flow-guiding members 212, 222, 232 are respectively an elongated rib.

Figure 4:
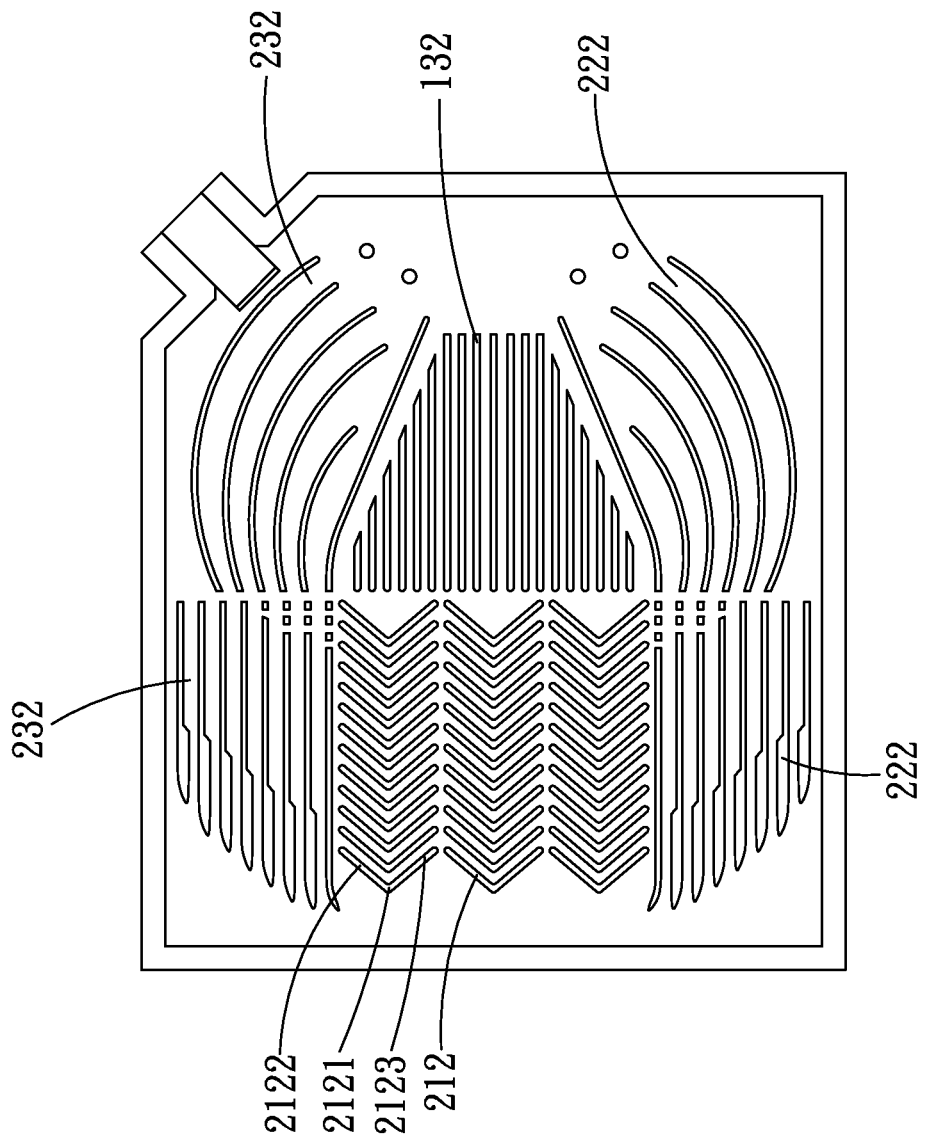
FIG. 4 is a top view of a slim-type pressure-gradient-driven low-pressure thermosiphon plate according to a second embodiment of the present invention.

Please refer to FIG. 4 that shows a slim-type pressure-gradient-driven low-pressure thermosiphon plate according to a second embodiment of the present invention. Since the second embodiment is similar to the first and preferred embodiment in some of the structure and the element connection thereof, these similar portions are not repeatedly described herein. The second embodiment is different from the first and preferred embodiment in that the first flow-guiding members 212 are respectively a substantially V-shaped rib. The V-shaped ribs each include a first vertex 2121, a first edge 2122, and a second edge 2123. The first edge 2122 and the second edge 2123 of each of the V-shaped ribs meet with each other at the first vertex 2121.

Figure 5:
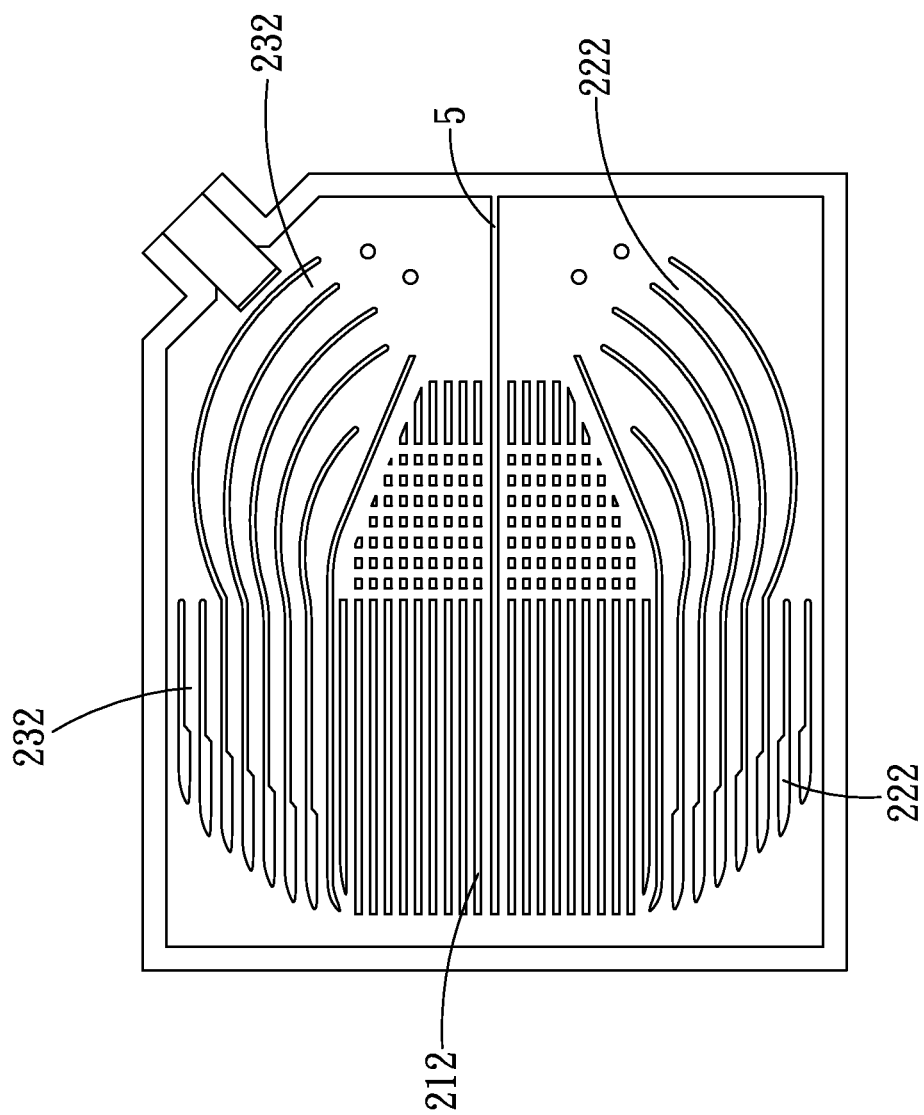
FIG. 5 is a top view of a slim-type pressure-gradient-driven low-pressure thermosiphon plate according to a third embodiment of the present invention.

Please refer to FIG. 5 that shows a slim-type pressure-gradient-driven low-pressure thermosiphon plate according to a third embodiment of the present invention. Since the third embodiment is similar to the first and preferred embodiment in some of the structure and the element connection thereof, these similar portions are not repeatedly described herein. The third embodiment is different from the first and preferred embodiment in that the main body 1 further includes a raised rib 5, which longitudinally extends through the heat receiving zone 11, the pressure accumulating zone 13, and the first flow passage unit 21.

Figure 6:
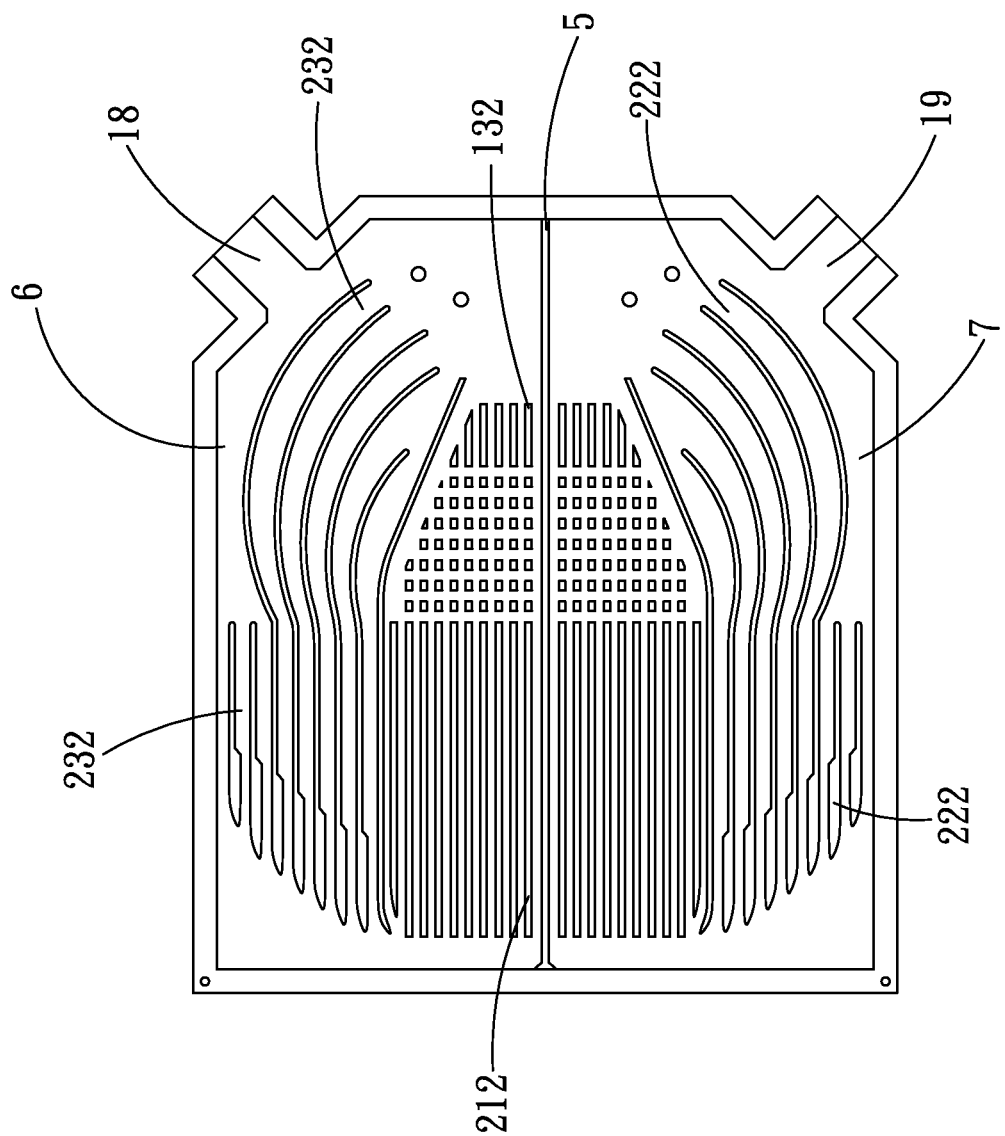
FIG. 6 is a top view of a slim-type pressure-gradient-driven low-pressure thermosiphon plate according to a fourth embodiment of the present invention.

Please refer to FIG. 6 that shows a slim-type pressure-gradient-driven low-pressure thermosiphon plate according to a fourth embodiment of the present invention. Since the fourth embodiment is similar to the first and preferred embodiment in some of the structure and the element connection thereof, these similar portions are not repeatedly described herein. The fourth embodiment is different from the first and preferred embodiment in that the main body 1 further includes a raised rib 5, a first outlet 18, and a second outlet 19. The raised rib 5 longitudinally extends through the heat receiving zone 11, the pressure accumulating zone 13, and the first flow passage unit 21 to define a first part 6 and a second part 7 in the main body 1.

Figure 7:
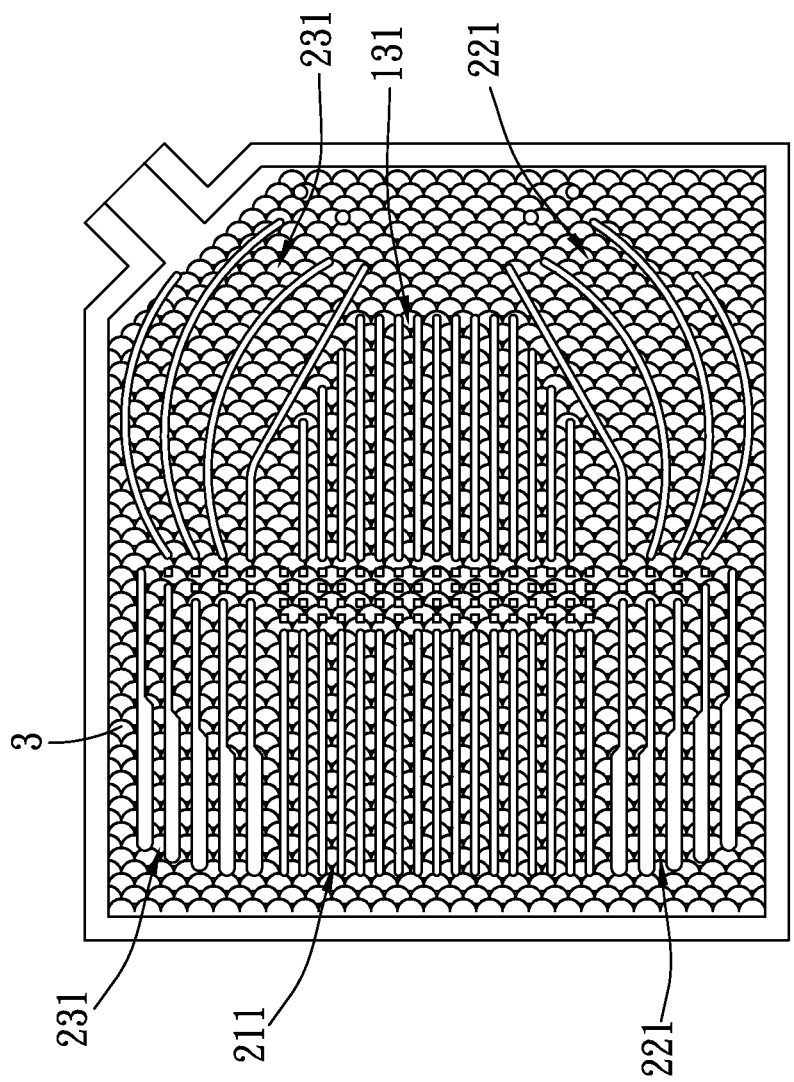
FIG. 7 is a top view of a slim-type pressure-gradient-driven low-pressure thermosiphon plate according to a fifth embodiment of the present invention.

Please refer to FIG. 7 that shows a slim-type pressure-gradient-driven low-pressure thermosiphon plate according to a fifth embodiment of the present invention. Since the fifth embodiment is similar to the first and preferred embodiment in some of the structure and the element connection thereof, these similar portions are not repeatedly described herein. The fifth embodiment is different from the first and preferred embodiment in that a plurality of recesses 3 is provided on the main body 1 between the first, second and third flow-guiding members 211, 221, 231. The recesses 3 each can be in the shape of a circle, a rectangle, a triangle, a fish scale, or any other geometrical shape. In the illustrated fifth embodiment, the recesses 3 are respectively in the shape of a fish scale without being limited thereto. The recesses 3 can also be provided in the aforesaid first, second, third and fourth embodiments.

Please refer to FIGS. 3 to 6 at the same time. As shown, the first and preferred embodiment and the second to the fourth embodiment of the present invention all propose a slim type two-phase pressure-gradient-driven low-pressure thermosiphon plate as a circulation and cooling technique. This is a type of self-driven circulation. The working fluid used in the thermosiphon plate can be a coolant selected from any one of purified water, methanol, acetone, and R134A. An interior of the slim type two-phase pressure-gradient-driven low-pressure thermosiphon plate is in a vacuum state. Thus, the working fluid filled in the thermosiphon plate has a saturation temperature, i.e. a boiling point, ranged between 20° C. and 30° C. Overheated vapor bubbles 4 formed in the array of the raised posts 111 within the heat receiving zone 11 flow through the free zone 12 to thereby have instantaneously reduced pressure and produce a pressure gradient in the main body 1 needed to drive steam-water circulation in the slim type pressure-gradient-driven low-pressure thermosiphon plate. In addition, the vapor bubbles 4 condense in the first, second, third and fourth condensing zones 14, 15, 16, 17 to produce condensate, and the condensate is guided by the first, second and third flow passage units 21, 22, 23 to flow back to the heat receiving zone 11, i.e. the zone with the arrayed raised posts 111, to complete one cycle of steam-water circulation.

That is, with the present invention, overheated vapor is produced in the main body 1 at the heat receiving zone 11 in contact with a heat-producing element (not shown) to thereby drive steam-water circulation in the thermosiphon plate of the present invention. In other words, heat is transferred to a surface of the main body 1 corresponding to the heat receiving zone 11, and is then further transferred to the heat receiving zone 11 to cause a boiling condition to vaporize part of the working fluid in the thermosiphon plate. Thereafter, when the produced vapor bubbles is overheated, pressure is produced (i.e. the pressure accumulating zone 13 has relatively higher pressure) to push the working fluid to move from the heat receiving zone 11 through the pressure accumulating zone 13 and the free zone 12 to the first, second, third and fourth condensing zones 14, 15, 16, 17 to release heat and become condensed. The condensed working fluid is pressurized at the first flow passage unit 21 and flows back to the heat receiving zone 11. The working fluid flows back to the heat receiving zone 11, which is in contact with the heat-producing element (not shown) to absorb heat, and absorbs heat from the raised posts 111 to start another steam-water circulation in the thermosiphon plate again.

In the present invention, vaporization (i.e. increasing pressure) and condensation (i.e. reducing pressure) are used to create the pressure gradient and circulating flow passages needed to enable steam-water circulation. Thus, the use of any wick structure is avoided to allow a largely reduce overall thickness of the vapor chamber (VC). Moreover, the slim type pressure-gradient-driven low-pressure thermosiphon plate can have largely improved temperature uniformity and reduced thermal resistance.

Further, to ensure good circulation of the working fluid in the thermosiphon plate, a capillary structure, such as a mesh structure, can still be additionally provided to assist the working fluid to flow back to the pressure accumulating zone 13 or the heat receiving zone 11.

In recent years, many big-scale heat-dissipation apparatus manufacturers have devoted in various kinds of water-cooling techniques, particularly the active water cooling techniques, in which pumps are used to provide the dynamic force needed to enable the circulation of water in a pipeline system. However, the water-cooling techniques are subject to the reliability and the service life of the pump valves. On the other hand, the circulation cooling technique for the slim type pressure-gradient-driven low-pressure thermosiphon plate proposed by the present invention has the advantages of (1) having not any movable part in the system to thereby avoid the problems of part wearing and limited part service life, and (2) not requiring any external pump and internal wick structure to thereby enable reduced power consumption and elimination of operating noise.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A slim type pressure-gradient-driven low-pressure thermosiphon plate, comprising:
a main body including a heat receiving zone arranged near a central area thereof, a pressure accumulating zone and a first flow passage unit separately located at two opposite sides of the heat receiving zone, a free zone communicating with the pressure accumulating zone, a first condensing zone and a second condensing zone communicating with the free zone, a third condensing zone and a fourth condensing zone communicating with the first flow passage unit, a second flow passage unit located between the first and the third condensing zones to communicate the first condensing zone with the third condensing zone, and a third flow passage unit located between the second and the fourth condensing zone to communicate the second condensing zone with the fourth condensing zone;
wherein the first flow passage unit includes a plurality of first flow passages and a plurality of first flow-guiding members, the first flow-guiding members being arrayed to space from one another, and the first flow passages being respectively formed between two adjacent first flow-guiding members; and wherein the second flow passage unit includes a plurality of second flow passages and a plurality of second flow-guiding members, the second flow-guiding members being arrayed to space from one another, and the second flow passages being respectively formed between two adjacent second flow-guiding members; and wherein the third flow passage unit includes a plurality of third flow passages and a plurality of third flow-guiding members, the third flow-guiding members being arrayed to space from one another, and the third flow passages being respectively formed between two adjacent third flow-guiding members;
wherein the first flow-guiding members are respectively substantially V-shaped ribs configured to accumulate pressure without capillary pumping action and further to form three V-shaped rib sets; the three rib sets being located in a same plane and parallel with each other: a first gap being formed between the two adjacent V-shaped rib sets without any barriers therebetween; the V-shaped ribs respectively including a first vertex, a first edge and a second edge, and the first and the second edge of each of the V-shaped ribs meeting with each other at the first vertex; the first flow passages being respectively formed between two adjacent V-shaped ribs; and a cover being correspondingly closed onto the main body.

2. The slim type pressure-gradient-driven low-pressure thermosiphon plate as claimed in claim 1, wherein the heat receiving zone includes a plurality of raised posts being arrayed to space from one another by a first spacing.

3. The slim type pressure-gradient-driven low-pressure thermosiphon plate as claimed in claim 1, wherein the first, second and third flow-guiding members are respectively an elongated rib.

4. The slim type pressure-gradient-driven low-pressure thermosiphon plate as claimed in claim 1 further comprising a plurality of recesses provided on the main body between adjacent first flow passages, adjacent second flow passages, and adjacent third flow passages.

5. The slim type pressure-gradient-driven low-pressure thermosiphon plate as claimed in claim 4, wherein the recesses respectively have a shape selected from the group consisting of a circle, a rectangle, a triangle, a fish scale, and any other geometrical shape.

6. The slim type pressure-gradient-driven low-pressure thermosiphon plate as claimed in claim 1, wherein the main body has a working fluid filled therein, and the working fluid is a coolant selected from the group consisting of purified water, methanol, acetone and R134A.

7. The slim type pressure-gradient-driven low-pressure thermosiphon plate as claimed in claim 1, wherein the pressure accumulating zone includes a plurality of pressure-accumulating flow passages and a plurality of pressure-accumulating flow-guiding members; the pressure-accumulating flow-guiding members being arrayed to space from one another, and the pressure-accumulating flow passages being respectively formed between two adjacent pressure-accumulating flow-guiding members.

\* \* \* \* \*